US006781435B1

United States Patent
Gupta et al.

(10) Patent No.: US 6,781,435 B1
(45) Date of Patent: Aug. 24, 2004

(54) APPARATUS AND METHOD FOR CONVERTING A MULTI-BIT SIGNAL TO A SERIAL PULSE STREAM

(75) Inventors: Deepnarayan Gupta, Hawthorne, NY (US); Alan Kadin, Irvington, NY (US)

(73) Assignee: Hypres, Inc., Elmsford, NY (US)

( * ) Notice: Subject to any disclaimer, the term of this patent is extended or adjusted under 35 U.S.C. 154(b) by 0 days.

(21) Appl. No.: 10/356,859

(22) Filed: Feb. 3, 2003

(51) Int. Cl.⁷ .............................................. H03K 17/62
(52) U.S. Cl. ........................ 327/407; 327/403; 341/101
(58) Field of Search ................................ 327/164, 165, 327/291, 295, 298, 403, 407; 341/50, 101; 375/242

(56) References Cited

U.S. PATENT DOCUMENTS

| | | | | | |
|---|---|---|---|---|---|
| 5,216,671 A | * | 6/1993 | Nutter | ......................... | 370/536 |
| 5,247,652 A | * | 9/1993 | Uda | ............................. | 710/71 |
| 5,398,270 A | * | 3/1995 | Cho et al. | ...................... | 377/39 |
| 5,726,651 A | * | 3/1998 | Belot | .......................... | 341/101 |
| 5,760,707 A | * | 6/1998 | Katagiri | ................. | 340/870.11 |
| 5,982,309 A | * | 11/1999 | Xi et al. | ...................... | 341/101 |
| 6,157,678 A | * | 12/2000 | Wei | ............................. | 375/243 |
| 6,232,895 B1 | * | 5/2001 | Djupsjobacka et al. | ..... | 341/100 |
| 6,329,935 B1 | * | 12/2001 | Stephen | ........................ | 341/81 |
| 6,335,696 B1 | * | 1/2002 | Aoyagi et al. | .............. | 341/100 |
| 6,437,725 B1 | * | 8/2002 | Kwak et al. | ................. | 341/159 |
| 6,593,863 B2 | * | 7/2003 | Pitio | .......................... | 341/101 |
| 6,628,214 B1 | * | 9/2003 | Kawase et al. | ............. | 341/100 |

* cited by examiner

Primary Examiner—Timothy P. Callahan
Assistant Examiner—Hai L. Nguyen
(74) Attorney, Agent, or Firm—Henry I. Schanzer, Esq.

(57) ABSTRACT

A circuit for converting an n-bit number to a serial stream of single-bit pulses includes circuitry for generating n different sets of pulses; each set of pulses corresponding to a bit of the n-bit binary number; the number of pulses in a set of pulses corresponding to a bit "j" being equal to $2^{(j-1)}$ pulses, where "j" is an integer which varies from one (1) for the LSB to n for the MSB. The circuit also includes n switches each switch having an input port, an output port and a control port. Each different bit is applied to the control port of a switch and the set of pulses corresponding to the bit is applied to the control port of that switch. The output ports of the n switches are coupled to a common point for combining the signals at the output ports and producing a serial stream of single-bit pulses at the common point which is equivalent to the n-bit binary number. A shift register capable of storing $2^n-1$ pulses may be connected to the common point and digital to analog circuitry may be connected to the output of the shift register for producing an analog voltage.

28 Claims, 20 Drawing Sheets

US 6,781,435 B1

APPARATUS AND METHOD FOR CONVERTING A MULTI-BIT SIGNAL TO A SERIAL PULSE STREAM

This invention was made with Government support under contract DSAG60-02-P-0281 awarded by the U.S. Army Space and Missile Defense Command. The Government has certain rights in the invention.

BACKGROUND OF THE INVENTION

This invention relates to apparatus and methods for converting a multi-bit digital input signal into a single-bit sequence, such as a serial stream of pulses.

There are many applications where it is desirable to convert an N-bit signal into an equal-weighted one-bit stream. However, to maintain the accuracy of an N-bit signal, where the signal has a sampling frequency equal to $f_s$, the sampling frequency of the serial one-bit stream should be at least equal to $(2^N)(f_s)$. Where $(2^N)(f_s)$ is in the order of several gigahertz, or higher, conventional circuits are not fast enough to provide the needed response.

There are several approaches to the transformation of an N-bit binary number to an equal-weighted sequence of single-bit numbers. A prior art approach for converting an N-bit signal into a serial stream includes the use of a "thermometer code", in which a consecutive series of 1's are generated equal in number to the total weight of the N-bit number. For example, the 4-bit binary number 1000, which represents the decimal number 8, would be represented by 8 consecutive "1's", followed by 8 consecutive "0's", as shown in Table 2, below. If one has a sequence of time frames, each with 8 "1's" and 8 "0's", passing this sequence through a low-pass analog filter will generate an output proportional to the number 8. However, the strong clustering of 1's and 0's requires that the filter cutoff frequency be rather low. Another way of stating this is that the filter cutoff frequency be rather low. Another way of stating this is that the "quantization noise" associated with the conversion is predominantly at the frame frequency f. This limits the effective bandwidth of a digital-to-analog converter (DAC) used to convert the digital number into an analog voltage.

Another prior art approach, as shown in FIG. 16, includes a delta-sigma algorithm which relies on accumulators and feedback loops to generate an output sequence. The detailed circuit architecture depends on the order of the modulator and the number of bits. However, it is well known that an input that is ½ of full scale (such as the 4-bit number 1000 again) into a basic delta-sigma modulator will generate an output that is an alternating sequence of 1 and 0. This has the same average density as the thermometer code, but the "quantization noise" is predominantly at a much higher frequency (8 times the frame frequency), so it is much easier to filter out. More generally, the quantization noise is "shaped" in the frequency spectrum, by pushing it up to high frequencies where it can be filtered easily. Delta-sigma modulators can offer outstanding performance, but the circuit architecture is often quite complex and difficult to implement accurately. If not done properly, a delta-sigma modulator can lead to excess noise associated with instabilities or oscillations.

SUMMARY OF THE INVENTION

Accordingly, one aspect of Applicants' invention includes novel apparatus and methods for converting an ordered N-bit (parallel) input signal into a serial stream of one-bit pulses.

Applicants' invention includes an encoding method for converting an N-bit binary number M to a sequence of $2^N$ single-bit numbers that contains M ones and $(2^N-M)$ zeros. For example, a four-bit binary number 1011 (equivalent to decimal number 11) is converted into a sequence of $2^4$ single-bit numbers: eleven ones and five zeros. Each 'one' in that sequence has equal weight. Such an encoder is not to be confused with a parallel-to-serial converter, which changes an N-bit number to an ordered sequence of N single-bit numbers, from a most significant bit (MSB) to a least significant bit (LSB), to preserve the relative weights of the original binary bits.

In circuits embodying the invention in order to convert a signal represented by an ordered N-bit number into an equivalent serial stream of one bit pulses, there is generated N different sets of pulses or N different sets of frequency signals. [For ease of discussion, sets of pulses will be used for purpose of illustration.] One set of pulses is generated per bit of the N-bit number with each set having a different number of pulses where the number of pulses in each set is a function of the order of the bit to which it corresponds; e.g., corresponding to the first bit or least significant bit (LSB)—one ($2^0$) pulse is produced; and corresponding to the Nth bit or most significant bit (MSB)—$2^{(N-1)}$ pulses are produced. In a binary system the number of pulses in each set increases by a factor of 2 for each higher order bit starting with the LSB. The pulses of the N sets of pulses may then be combined to form a serial sequence of pulses with contiguous, non-overlapping locations, with the pulses from the set corresponding to the MSB occupying every second location, the pulses from the next lower order bit occupying every fourth location, with the pulses from the sets corresponding to each additional lower order bit occupying one half the number of locations of its higher order bit (e.g., every eighth location, then every sixteenth location, etc.) until the LSB occupies one location.

In one embodiment the N different sets of pulses, corresponding to the bits of an N-bit word, are combined by means of N switches, with each one of the N switches being controlled by a different one of the N bits of the N-bit number. Each switch has a control port to which is applied a different bit of the N-bit number and an input port to which is applied the set of pulses corresponding to the order of the bit applied to that switch. Each switch has an output at which it produces, or reproduces, the value of the signal present at its input port when the value of the bit at its control port is a logic "1". The outputs of the N switches are then combined to produce a serial stream of single-bit pulses corresponding to the value of the N-bit number.

In binary systems, the N bits of the N-bit number are ordered; the first bit, Bit 0, of the N-bit word which is the least significant bit (LSB) and which may also be defined B(0), has a value equal to $2^0$ corresponding to which 1 pulse is generated; the next higher bit of the N-bit word which may be defined as Bit(1), has a value equal to $2^1$ corresponding to which 2 pulses are generated; the $N^{th}$ bit of the N-bit word which is the most significant bit (MSB) may be defined as B(N-1) and has a value equal to $2^{(N-1)}$ corresponding to which $2^{(N-1)}$ pulses are generated. In general, the $j^{th}$ bit of the N-bit word may be defined as B(j-1) and has a value equal to $2^{(j-1)}$ corresponding to which $2^{(j-1)}$ pulses are generated; where j varies from 1 for the LSB to N for the MSB. Corresponding to each bit of the N-bit word there is produced a corresponding set of pulses (or sets of frequency signals) proportional to the order of the bit. Thus, in general, for the $j^{th}$ bit of the N-bit word there is produced $2^{(j-1)}$ pulses (or a frequency signal equal to $f/2^{(N+1-j)}$.

The sets of pulses or the frequency signals generated corresponding to each of the N-bit number may be combined by N switches, one switch per bit of the N-bit signal, with each switch having an input port and an output port and a control port to which is applied a different bit of the N-bit word. The different set of pulses are applied to the input port of a switch in correspondence to the order of the bit applied to the control port of the switch. Each switch produces at its output port a set of pulses corresponding to the ones applied to its input when the value of the bit applied to its control port is a logic "1". The outputs of the switches may be combined via an OR circuit and supplied to a common output point at which is produced a serial stream of single-bit pulses having a value corresponding to the N-bit number.

The common output point may be coupled to the input of a shift register whose number of locations (length) is equal to $2^N$, for further processing and/or storage. The N bits of an N-bit number are assigned and can fill up to $2^N-1$ locations of the shift register, leaving one blank. In the staggered thermometer algorithm embodying the invention, the Nth bit, MSB or B(N−1), occupies every other location, starting from the second location. The next less significant bit B(N−2) occupies every fourth location, starting from the third location. B(N−j) occupies every $2^j$ th location, starting with the $(1+2^{j-1})$th location. Finally, the LSB or B(0) occupies the $(1+2^{N-1})$th location.

In many applications where an N-bit signal is converted into a serial one-bit stream of pulses, the conversion is of interest to perform a digital to analog conversion. That is, the one-bit serial stream should be suitable for generating an analog voltage which is an accurate representation of the N-bit signal. Thus, another aspect of the invention includes apparatus and methods for taking a multi-bit digital signal and converting it to an analog signal. Thus, apparatus embodying the invention functions as a digital-to-analog converter or DAC.

Applicants' invention, which may be referred to as a "staggered" or "interleaved" thermometer encoder, offers advantages over a delta-sigma encoder approach due its simplicity. In particular, delta-sigma encoders require a feedback algorithm. No such feedback is present or needed in circuits embodying Applicant's invention. In the "staggered thermometer code" embodying the invention the 1's are distributed fairly evenly across a frame period, rather than being bunched together at one end, as is the case for a simple thermometer code. This leads to a shaped quantization noise, similar but not identical to that found in a delta-sigma code, which can be efficiently filtered out in a low-pass filter. Furthermore, Applicants' invention can be implemented using a straightforward circuit architecture, scalable to an arbitrary number of bits.

This is particularly relevant to implementation using high speed superconducting circuits based on Josephson junctions and rapid-single-flux-quantum (RSFQ) digital logic. Applicants have shown that a pattern generator for the "staggered" thermometer code can be constructed using a set of standard clocked RSFQ cells, including T-flip-flops, splitters, digital delays, and storage registers. Given the extremely high clock speeds and ideal linearity available with RSFQ technology, this architecture is amenable to the development of a highly linear, broadband DAC with many bits of precision. Thus, another aspect of Applicants' invention includes the use of superconducting circuitry and/or extremely fast semiconductor circuits which can produce the desired response.

BRIEF DESCRIPTION OF THE DRAWINGS

In the accompanying drawings like reference characters denote like components.

DETAILED DESCRIPTION OF THE INVENTION

Figure 1:
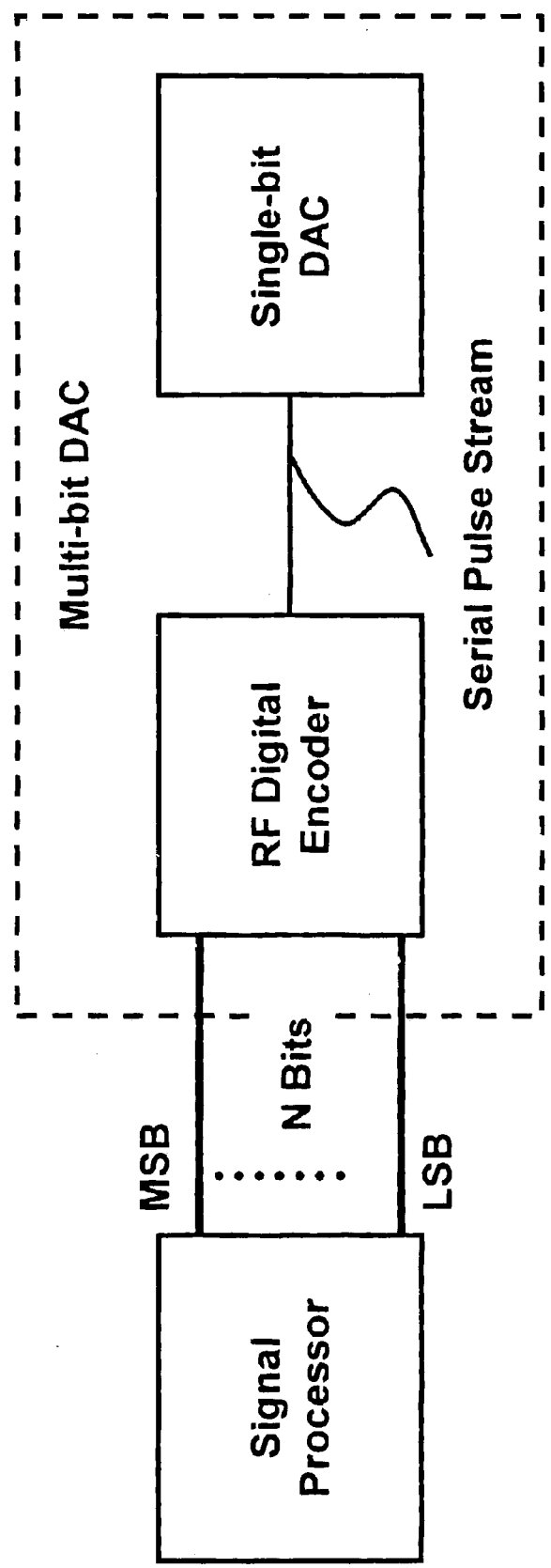
FIGS. 1 and 2 are block diagrams of circuits in which multi-bit signals are converted to serial bit streams for signal processing and digital to analog conversion in accordance with the invention.
Figure 2:
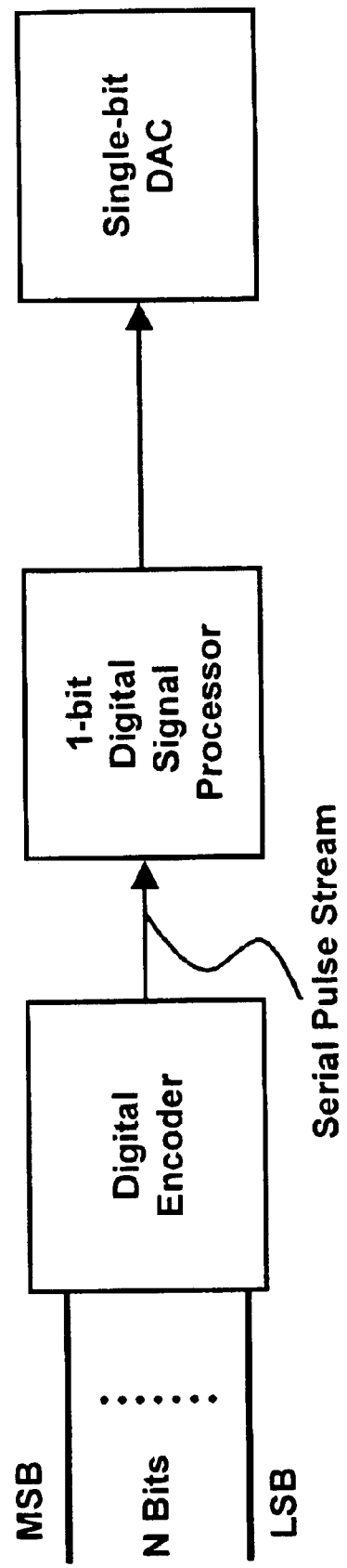

Applicants' invention relates to apparatus and methods for converting a multi-bit number to an equivalent serial stream of single-bit pulses. The invention may be particularly useful when an N-bit binary number (or word) is to be converted to an analog voltage; where N may be any number greater than one (1). The N-bits of the N-bit binary number are applied (in parallel) to a first circuit (e.g., an encoder) for converting the N-bits to an equivalent serial stream of single bit pulses. The serial stream may then be supplied directly to a simple digital-to-analog converter (DAC) as shown in FIG. 1 or via a signal processor as shown in FIG. 2. FIG. 1 is a block diagram showing a signal processor applying an N-bit binary word on parallel lines to an RF digital encoder, of the type shown in FIG. 7, for converting the N-bits to an equivalent serial stream of single-bit pulses which are then applied to a digital to analog converter (DAC). FIG. 2 is a block diagram showing an N-bit binary word applied to a digital encoder for converting the N-bits to an equivalent serial stream of single-bit pulses which are then applied to a single-bit digital signal processor whose output is applied to a DAC. This encoding scheme permits single-bit processing of digital data with much simpler circuit hardware—although at a higher speed—than would be required for multi-bit processing. Therefore, this scheme is particularly well-suited to ultra-fast, low-complexity electronics, such as present-day superconducting electronics.

Before discussing the invention in detail, reference will first be made to FIGS. 3, 4, 5, and 6 which relate to different digital RF pre-distortion circuits which include encoders and DACs which may be implemented using circuits embodying the invention. Digital pre-distortion may be used to compensate for the non-linearity of HPAs as taught and shown in co-pending application titled Power Amplifier Linearization, bearing Ser. No. 10/357,130, being filed contemporaneously herewith, and assigned to the Assignee of the present application, and whose teachings are incorporated herein by reference. Performing the predistortion function directly on the RF waveform permits superior correction of amplifier distortion over broader frequency bands. However, this requires digital processing at very high speed. The encoder circuit embodying the invention reduces the complexity of high speed digital processing, enabling such applications as digital RF predistortion.

Figure 3:
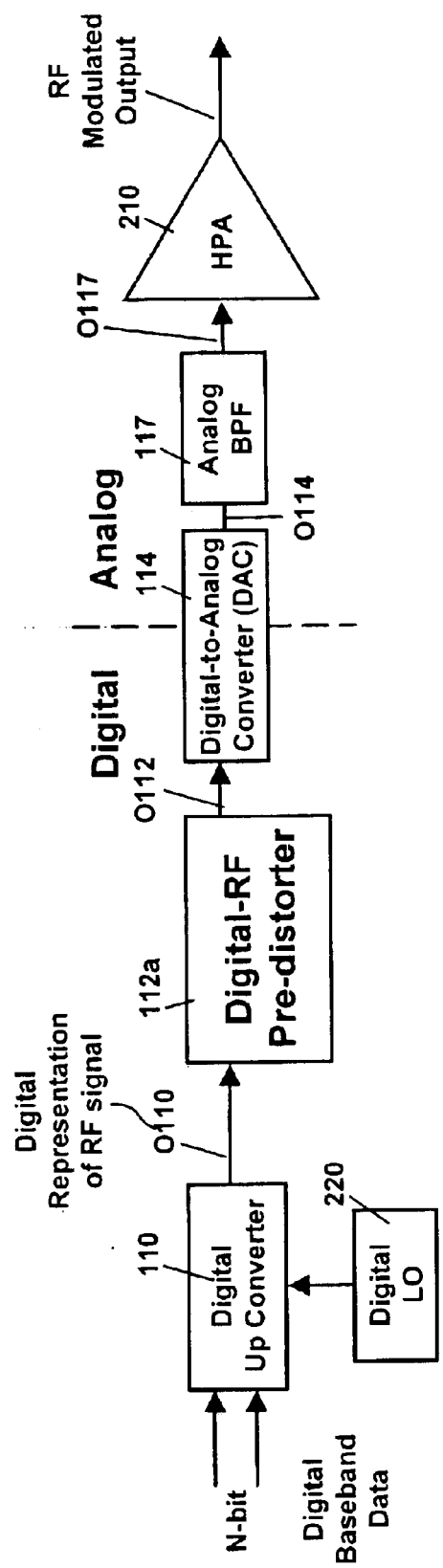
FIGS. 3, 4, 5, 6 are block diagrams of different digital RF predistortion circuits employing encoding circuits embodying the invention.

In FIG. 3, multi-bit digital baseband signals are supplied to a digital-up-converter (DUC) 110 which is modulated by a digital local oscillator 220. The output O110 of DUC 110 is a multi-bit RF modulated signal (e.g., at more than 10 or 20 giga-samples per second, GSPS). The number of bits (for each signal sample) is normally selected to meet desired system requirements of precision and accuracy, with the precision and accuracy increasing with the number of bits. However, to handle a greater number of bits requires a corresponding increase in circuitry to handle the bits and this is often the limiting factor on the total number of bits (where the number of bits typically, but not necessarily, increase in binary fashion). The RF modulated output O110 of up-converter 110 is fed to an input port of a digital RF predistorter 112a having an output port O112 at which is produced a predistorted output signal which is fed to an RF digital-to-analog converter (DAC) 114 whose output O114 is fed to an analog bandpass filter 117. DAC 114 may include circuitry of the type shown in FIG. 7. The output O117 of analog BPF 117 is fed to an input port of a high power amplifier (HPA) 210 to produce an RF modulated output signal at its output port.

Figure 4:
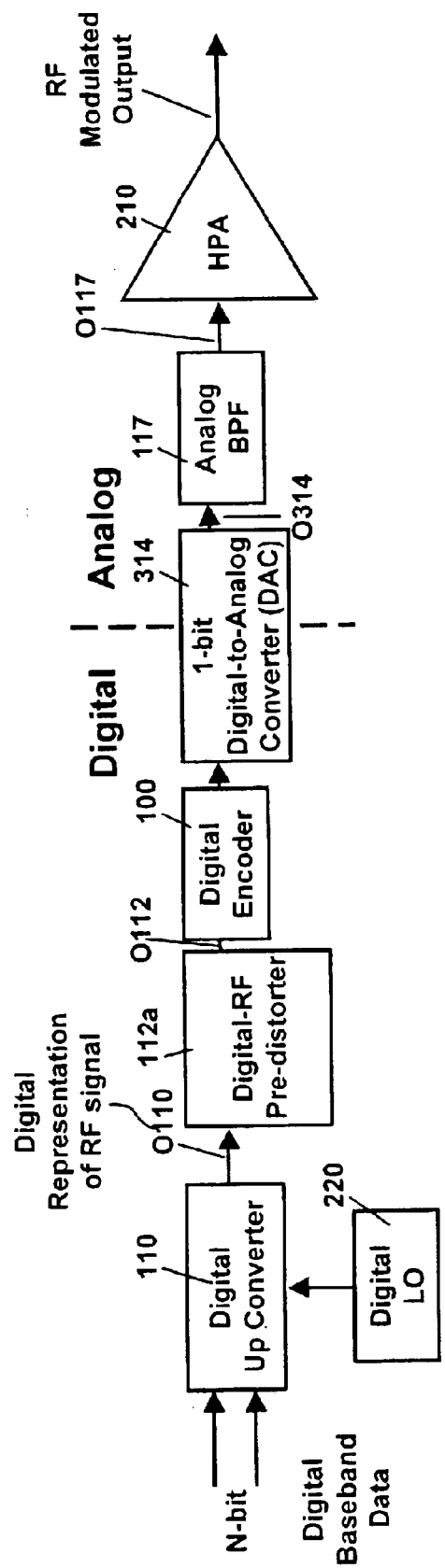
Figure 5:
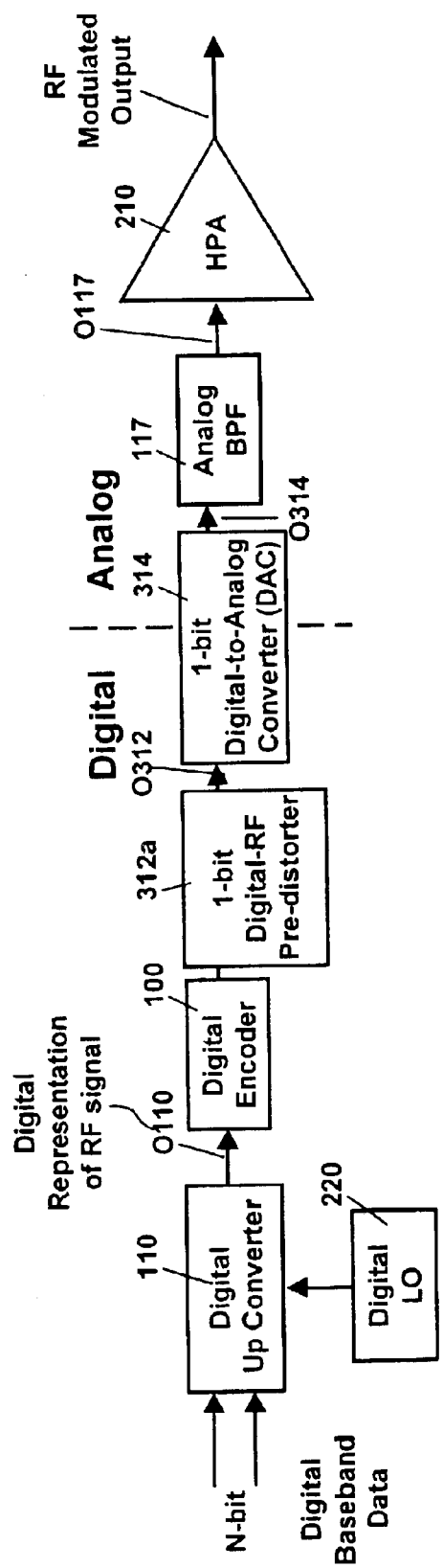
Figure 6:
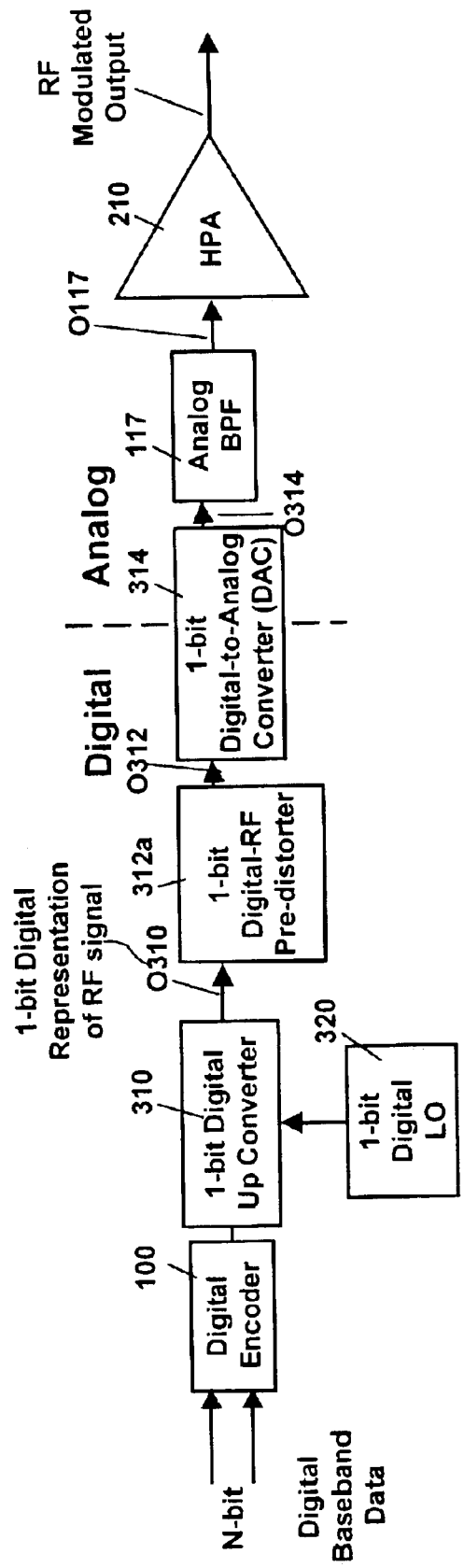

The conversion from multi-bit data words to single-bit sequences may be performed at different locations in the processing chain. FIG. 4 shows one such scheme where the encoder 100 is combined with a 1-bit DAC 314. FIG. 5 shows another scheme where the encoder 100 is combined with a 1-bit digital-RF predistorter 312a and a 1-bit DAC 314. FIG. 6 shows yet another scheme where the encoder 100 is combined with a 1-bit digital up converter 310, which is fed by a 1-bit digital local oscillator 320, 1-bit digital-RF predistorter 312a and a 1-bit DAC 314.

As noted above, the invention includes a digital encoder which may be used as part of a novel digital-to-analog converter for use in a superconducting direct digital synthesizer for rf signals. The predistortion function may be combined with direct synthesis of the analog RF waveform from its digital representation. The most natural implementation of the predistortion DAC using superconducting RSFQ circuits is the generation and manipulation of a single-bit (i.e., 1-bit) oversampled stream of SFQ pulses.

As discussed above, in systems embodying the invention a multi-bit number (or word) may be converted into a serial stream of single-bit pulses which may be supplied to a single-bit DAC for producing a corresponding analog voltage; i.e., doing a digital-to-analog conversion (DAC). There are various methods of generating a 1-bit serial pulse stream from multi-bit binary data. However, Applicants have invented an encoding scheme, which may be called a staggered or interleaved thermometer code, which lends itself to convenient circuit implementation with existing RSFQ cells; although any other suitable circuitry may be used. Moreover, the staggered or interleaved thermometer code has high-frequency quantization noise-shaping properties similar to the widely used delta-sigma code.

For ease of the description to follow and to better illustrate and understand the invention and the appended claims reference is made to Table 1 below.

In accordance with the invention, each bit of an N-bit word is assigned an equivalent weight corresponding to its order. Thus, assume that an N-bit word (e. g., a 4-bit word) having a sampling frequency of $f_s$ is applied to an encoder and a DAC. During each cycle (or period) of the sampling frequency, $f_s$, for each bit of the N-bit word there is produced a frequency signal (e.g., a number of pulses) representing the equivalent weight of the bit. The number of pulses or the frequency of the signal assigned to each bit may be illustrated by reference to the two right hand columns of TABLE 1.

TABLE 1

| | | | | | |
|---|---|---|---|---|---|
| MSB | $N^{TH}$ BIT | B(N − 1) | $2^{N-1}$ | $2^{N-1}$ pulses/cycle or $[2^{N-1}]f_s$ | $f/2$ |
| | $j^{TH}$ BIT | B(j − 1) | $2^{j-1}$ | $2^{j-1}$ pulses/cycle or $[2^{j-1}]f_s$ | $f/2^{(N+1-j)}$ |
| | $4^{TH}$ BIT | B(3) | $2^3$ | 8 pulses/cycle or $8f_s$ | $f/2^{(N-3)}$ |
| | $3^{RD}$ BIT | B(2) | $2^2$ | 4 pulses/cycle or $4f_s$ | $f/2^{(N-2)}$ |
| | $2^{ND}$ BIT | B(1) | $2^1$ | 2 pulses/cycle or $2f_s$ | $f/2^{(N-1)}$ |
| LSB | $1^{ST}$ BIT | B(0) | $2^0$ | 1 pulse/cycle or $f_s$ | $f/2^N$ |

Corresponding to each ordered bit of the n-bit word there is generated a corresponding frequency signal or number of pulses; i.e., there are n different sets of frequency signals (or sets of pulses) for the n-bits; one set per bit; each set having a value representative of its corresponding bit. In accordance with the invention, the n different sets of frequency signals are interleaved into a serial stream representative of the value of the n-bit number such that pulses corresponding to the lower order bits appear between pulses corresponding to higher order bits as further discussed below.

Figure 7:
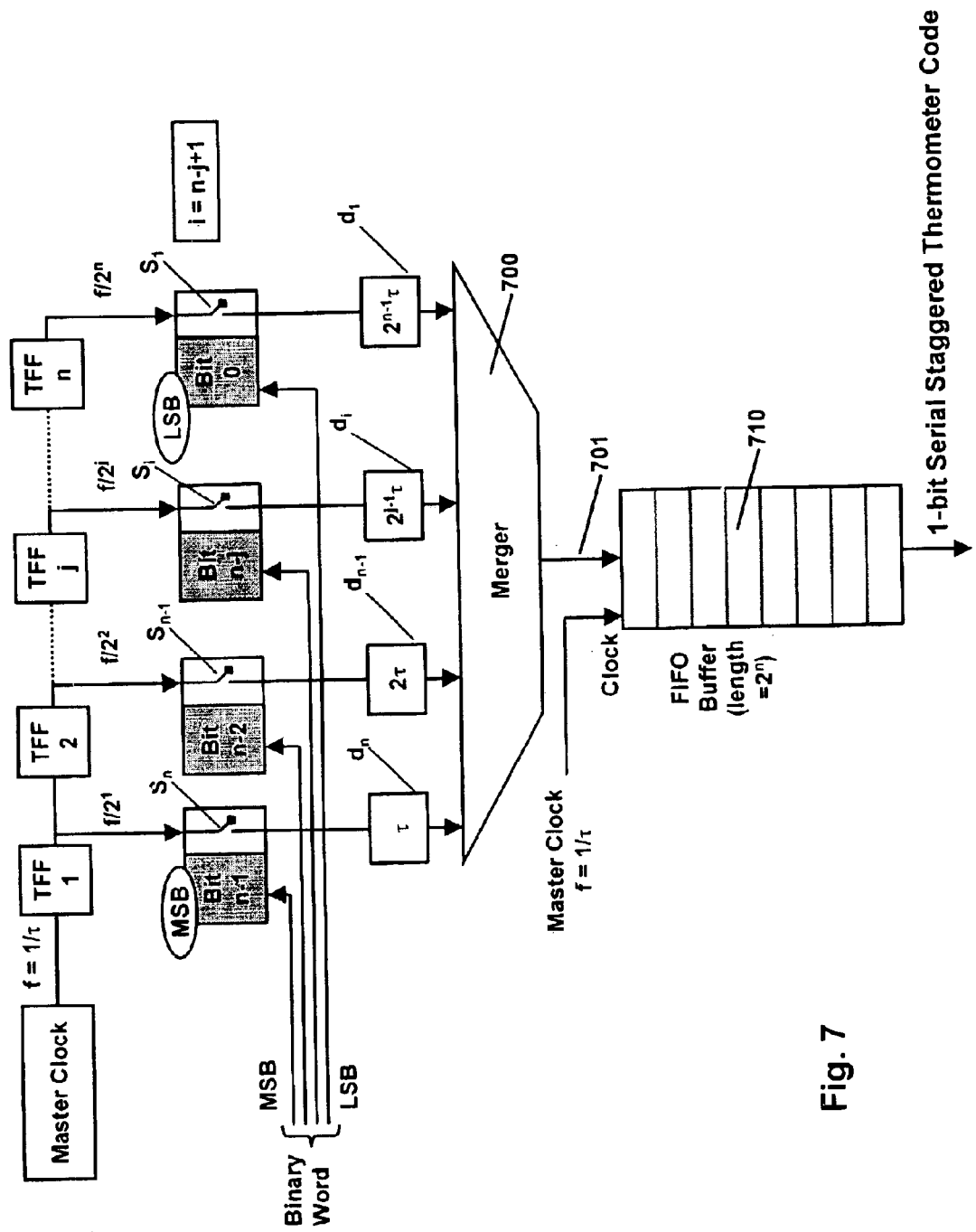
FIG. 7 is a block diagram of a digital encoding scheme for converting an n-bit number to a one bit serial code.

FIG. 7 is a block diagram of an encoder circuit embodying the invention for converting an n-bit binary number (or word) into a 1-bit serial sequencing code. The n-bits (B(0) to B(n−1)) of the word, which have a predetermined order, are applied to a set of n switches ($S_1$–$S_n$); there is one bit per switch, each bit controlling the conductivity of its corresponding switch. Each switch ($S_i$) may be described as having an input port to which is applied a frequency signal (or a set of pulses), a control port to which is applied one bit of the n-bit word, and an output port. Each switch ($S_1$–$S_n$) controls the flow of the frequency signals (i.e., (f/2 through $f/2^n$) applied to its input port as a function of the value of the binary bit applied to the control port of the switch. If the value of the binary bit applied to the control port of a switch is a logic "1" its corresponding clock stream (e.g., comprised of SFQ pulses) propagates through the switch and is reproduced at the output port of the switch; but, if the value of the bit is a logic "0", the clock stream does not flow through the switch (e.g., the pulses are rejected). Thus, when the value qf the bit applied to the control port of a switch has a value of logic "1" it is assumed that the frequency signal for pulses present at the input port of the switch passes to, or is reproduced at, the output port of the switch. When the value of the bit applied to the control port of a switch has a value of logic "0" it is assumed that no signal is passed to, or is produced at, the output port of the switch. Thus, each switch allows (or blocks) the passage of a frequency signal (or a set of pulses) applied to an input port of the switch.

Corresponding to each bit of the N-bit word a unique frequency signal or set of pulses is generated. In FIG. 7 there is a master clock circuit 71 for generating a clock signal of frequency "f" from which is generated a set of n binary sub-harmonics of the master clock (f); i.e., a different sub-harmonic is generated corresponding to each bit of the n-bit binary word. In FIG. 7 this is done by applying the master clock of frequency f to a series of "n" toggle flip flops (TFF); each of which functions as a divide-by-two circuit. Thus, at the output of each $j^{th}$ one of the n TFFs there is produced a corresponding lower frequency signal equal to $f/2^j$, as j increases from 1 to n.

Figure 14B:
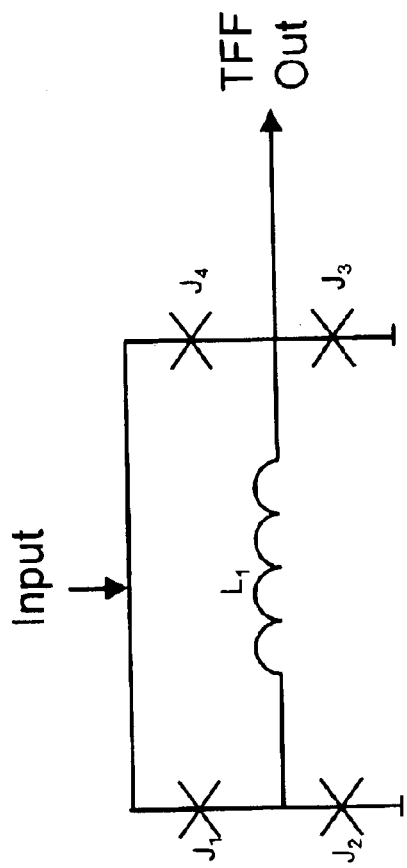
FIGS. 14(*a*) and 14(*b*) are, respectively, the symbolic representation of a toggle flip-flop (TFF) cell useable as a binary divider and its circuit schematic representation.
Figure 14A:
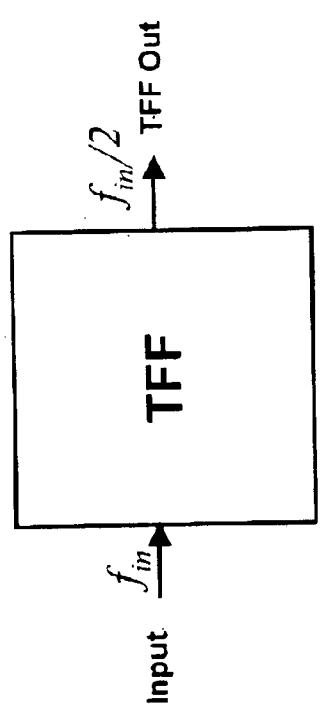

The toggle flip-flops (TFFs) may be represented as shown in block form in FIG. 14a with an input to which input signals ($f_{in}$) are applied and an output at which output signals ($f_{in}/2$) are produced; where the output signals have one half the frequency of the input signals. FIG. 14b is a schematic diagram of a super-conducting TFF circuit suitable for use in practicing the invention. The circuit includes Josephson junctions (J1–J4) and an inductive coil L1. A pulse arriving at the input alters the state of the flip-flop (from '0' to '1' or from '1' to '0'). A sequence of pulses alternately sets and resets the flip-flop, producing a pulse at the output for every other input pulse.

Referring back to FIG. 7, each one of the outputs of the various toggle flip-flops (i.e., TFF(1)–TFF(n)) is applied to the input port of a respective one of the n switches to which are applied the various bits of the n-bit binary word. There are n switches, ($S_1$–$S_n$), where each switch is controlled (set) by a corresponding one of the binary bits. The first bit of the n-bit number which is defined as the least significant bit (LSB), also identified as Bit "0", is applied to the control port of the switch identified as $S_1$ and the nth bit of the n-bit number which is defined as the most significant bit (MSB), also identified as B(n−1), is applied to the control port of switch $S_n$. Each intermediate bit is applied to a corresponding intermediate switch. Thus, each bit of the "n" bit number (or n-bit word) is applied to the control port of a different one of the n switches, in an ordered manner, for controlling the passage of the corresponding frequency signals applied to the input port of the switch. Each bit of the n-bit word is applied to the control port of a switch (i.e., $S_1$–$S_n$) to control the passage of a corresponding frequency signal applied to the input port of its switch. The frequency signal and/or the set of pulses applied to the input port of a switch corresponds to (and/or depends on) the order of the bit applied to the control port of the switch. That is, the switch ($S_n$) to which the most significant bit (MSB), of the binary number to be converted, is applied has the highest clock frequency signal (f/2) applied to its input port and the switch ($S_1$) to which the least significant bit (LSB), of the binary number to be converted, is applied has the lowest clock frequency signal ($f/2^n$) applied to its input port. Thus the MSB corresponds to, and controls, the passage of the highest clock frequency signal (f/2), while the LSB corresponds to and controls the passage of the lowest frequency signal ($f/2^n$). The passage of the set of pulses having the largest number of pulses and/or the highest frequency signal is controlled by the switch to which the MSB is applied and, in an ordered sequence, the passage of the set of pulses having the lowest number of pulses and/or the lowest frequency signal is controlled by the switch to which the LSB is applied.

In FIG. 7 the least significant bit (LSB) is arbitrarily defined as Bit "0" and the most significant bit (MSB) is defined as Bit (n−1). For the nomenclature and reference characters assigned to the switches and to the frequency signals in FIG. 7, a frequency signal (e.g., $f/2^i = f/2^{(N+1)-i}$ or an equivalent set of pulses) is applied to the input port of each switch denoted as $S_i$, as i varies from 1 for LSB to n for MSB.

As already noted, the frequency signals may correspond to sets of pulses. Thus corresponding to MSB, the f/2 frequency signal may correspond to the generation of "n" pulses during a sampling cycle and corresponding to LSB the $f/2^n$ frequency signal may correspond to the generation of one (1) pulse during a sampling cycle.

Referring to FIG. 7, note that the frequency signals (or pulses) present at the output port of each switch ($S_1$–$S_n$) are applied to a corresponding delay element (e.g., $d_1$–$d_n$). The set of digital delay elements ($d_1$–$d_n$) are employed to prevent bunching of the pulses, as well as to assign appropriate locations within the frame. The output signals from the delay networks, which will appear as clock streams, are applied to a merging network 700 for merging these clock streams to provide a single-bit serial code on an output line 701. The delay elements ($d_1$–$d_n$) produce digital delays which are multiples of the master clock period ($\tau=1/f$). The location assignment, corresponding to the staggered thermometer code, is defined by choosing these delays to be binary multiples of the master clock period $\tau$. The delay $d_i$ connected at the output of switch $S_i$ has the value $2^{(n-i)}\tau$. For example, the delay $d_n$, corresponding to the MSB, is $2^0\tau$, while the delay $d_1$, corresponding to the LSB, is $2^{n-1}\tau$. The pulse streams are merged via merger circuit 700 having a tree of confluence buffer cells (which may be of the type shown in block form in FIG. 15(a) and schematically in FIG. 15(b) to ensure equal delay paths for each branch. After merger, the sequence of pulses occurring within each time frame of length $2^n\tau$ is equivalent to the n-bit word applied to the control port of the switches ($S_1$–$S_n$). While this encoding scheme is synchronous, so that the pulses occupy individual time slots ($\tau$) within the frame, additional synchronization is possible (but not necessary) by storing these frames in a shift register buffer. For clarity, we will refer to these time slots as locations within the buffer.

Figure 12B:
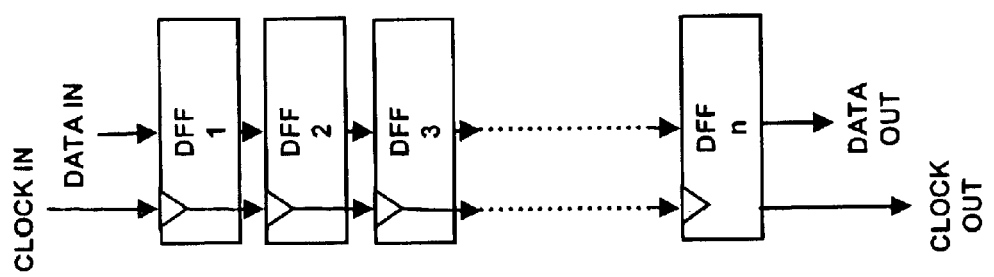
FIGS. 12(*a*) and 12(*b*) are respectively, a block diagram representation of a shift register and the interconnection of DFF cells to form a shift register suitable for use in practicing the invention.
Figure 12A:
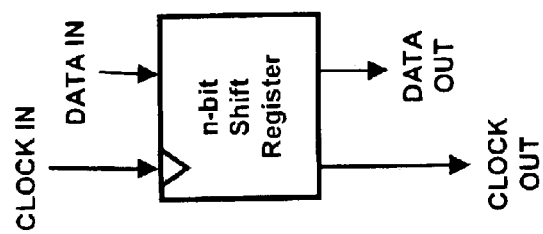

In FIG. 7, the merged serial bit stream from the delay networks is clocked through a first-in-first-out (FIFO) shift register 710. The n-bit number is represented as Bit 0 to Bit(n−1); where Bit 0 is the LSB and Bit (n−1) is the MSB. Each bit is assigned a set of locations in the shift register 710 having a frame of length of $2^n$. The most significant bit (MSB) is assigned $2^{n-1}$ locations, and each successive less significant bit is assigned half as many locations, with the LSB being assigned one location. The n-bits of an n-bit number are assigned and can fill up to $2^n-1$ locations, leaving one blank. In the staggered thermometer algorithm, in accordance with the invention and as illustrated in FIG. 8D, corresponding to the nth bit, MSB (Bit n−1), there is generated $2^{(n-1)}$ pulses which occupy every other location, starting from the second location. The next less significant bit (Bit n−2) occupies every fourth location, starting from the third location. In general, where j varies from 1 for the MSB condition to n for the LSB condition, then corresponding to Bit (n−j) there is produced $2^{(n-j)}$ pulses, [and/or a frequency signal equal to $f/2^j$], with one of these pulses occupying every $2^j$ th location, starting with the $(1+2^{j-1})$th location. Finally, the LSB (Bit 0) occupies the $(1+2^{n-1})$th location. The shift register may be formed as shown in FIG. 12, or it may have any other suitable form.

Figure 8A:
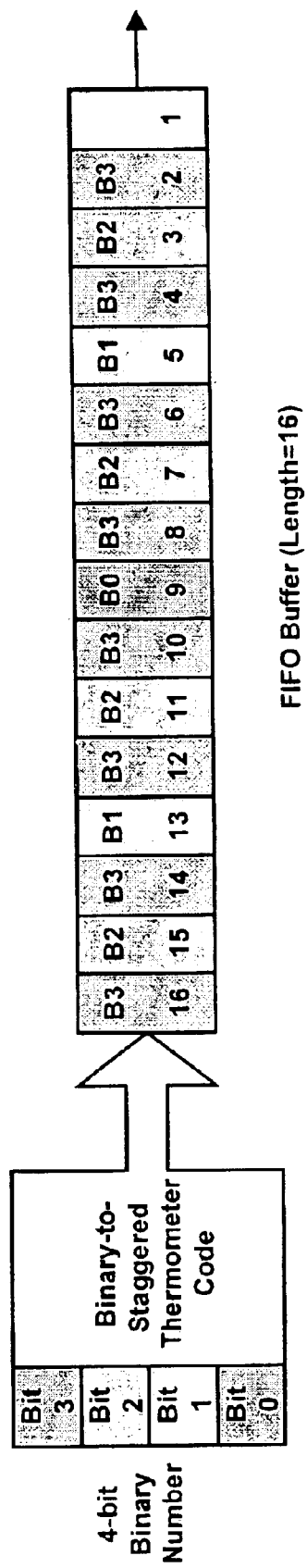
FIG. 8A shows the location assignment of a 4-bit binary number to a serial first-in first-out (FIFO) buffer in accordance with the invention.

FIG. 8A shows the location assignment of a 4-bit binary number to the serial FIFO shift register 710 having a length of 16 locations to accommodate the 4-bit number. The MSB or (B3) corresponds to Bit (n−j) where n=4 and j=1 for which there is generated $2^{(n-j)}$ pulses (i.e., 8 pulses, for n=4 and j=1) and these pulses occupy every other location starting with the second location, for a total of 8 locations. The next lower bit (B2) corresponds to Bit (n−j) where n=4 and j=2 for which there is generated $2^2$ pulses (i.e., 4 pulses, for n=4 and j=2) and these pulses occupy every fourth location starting from the third location. The 2 pulses generated for the next lower bit (B1) occupy every eighth location starting from the fourth location. The one pulse corresponding to LSB (B0) occupies the ninth location.

Figure 8B:
FIGS. 8B and 8C Illustrate the pattern of 11 single flux quantum (SFQ) pulses filling a buffer with a frame length of 16 locations and the generation of "output" pulses corresponding to each bit in accordance with the invention.
Figure 8C:
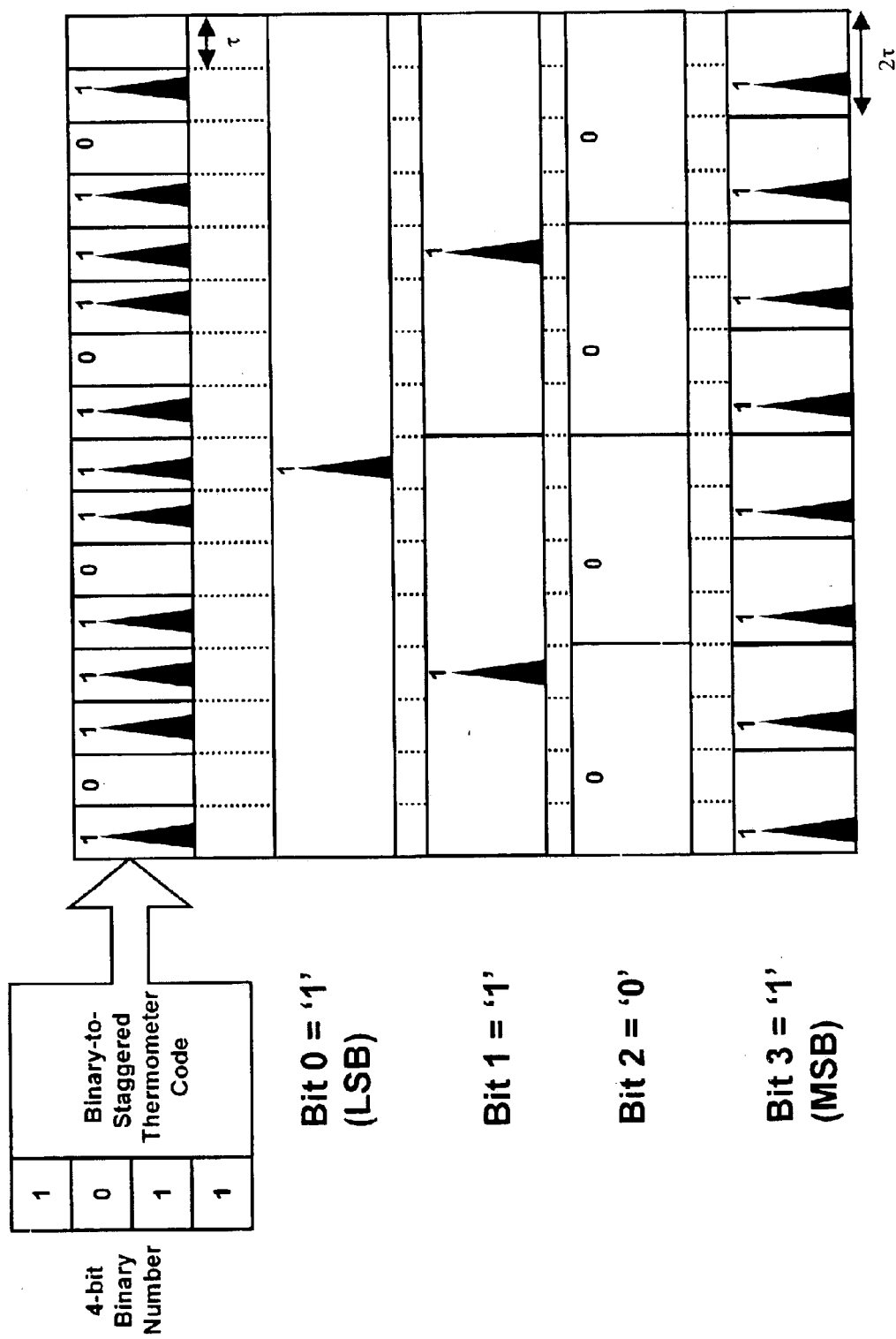
Figure 8D:
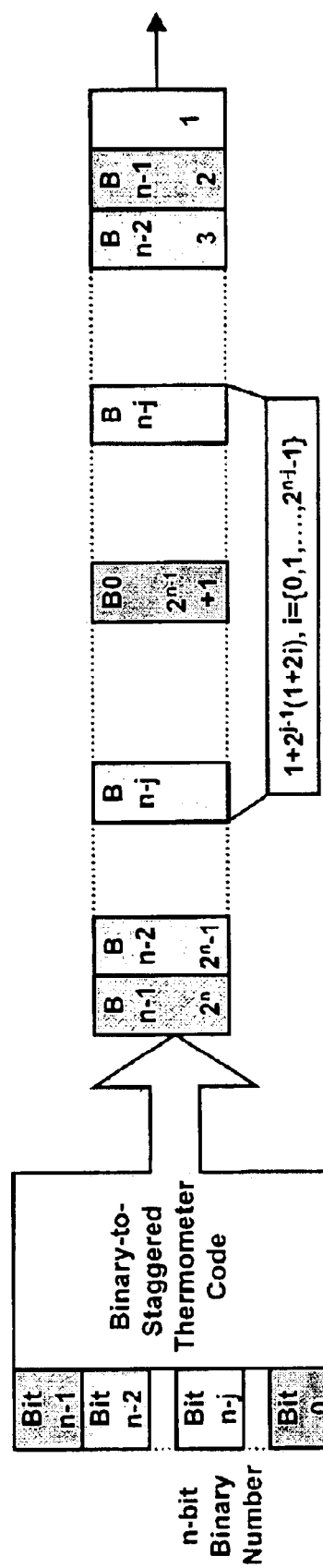
FIG. 8D shows the location assignment algorithm for an n-bit binary number, corresponding to the circuit scheme of FIG. 7.

FIG. 8B shows which locations of the register 710 would be filled for a 4-bit number whose bits have the values of 1011. The resulting pattern, as shown in FIG. 8B, would be a pattern of 11 pulses in the shift register 710 of length of 16. FIG. 8C shows how the frequency signals (i.e., the various pulses) generated at the outputs of the switches for the 4-bit binary word having a value of 1011 appear in their respective time slots and are then combined in their respective locations in a shift register or like register.

Table 2, below, compares the sequence of pulses generated by the Interleaved Thermometer Code of the invention with the sequence generated by the prior art delta sigma code and standard thermometer code.

Figure 9:
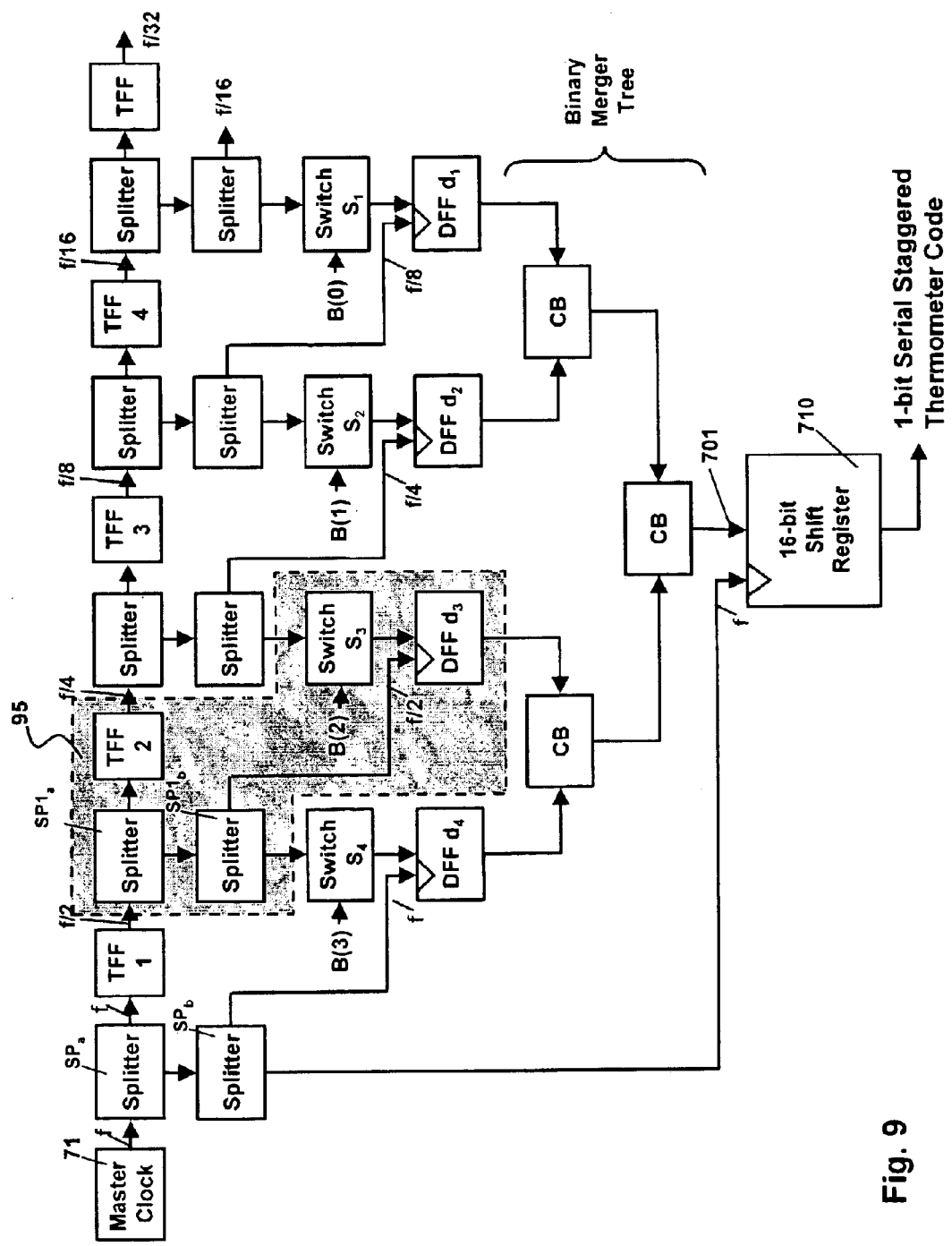
FIG. 9 is a detailed block diagram of a 4 bit staggered thermometer encoder circuit embodying the invention.

FIG. 9 is a more detailed schematic block diagram, which can be implemented using RSFQ superconducting circuitry, for converting a 4-bit binary number into a 1-bit serial frame of length $2^4$ in accordance with the invention. The circuit designed with a regular structure can be easily extended by repeating the shaded tile, 95. The different pulse streams are then merged with a binary tree of confluence buffers (CB) and passed through a shift register. FIG. 9 shows numerous splitters used to provide the same clocking signal to different circuit points. Thus the master clock 71 is coupled via splitter $SP_a$ to the input of TFF1 and to splitter $SP_b$. Splitter $SP_b$ then provides a clocking signal to DFF $d_4$ and to the clocking input of a shift register 710. FIG. 9 illustrates that the circuit may be designed with a regular structure which can be easily extended by repeating the components shown in box 95. The different pulse streams at the outputs of the switches ($S_1$–$S_4$) are then merged with a binary tree of confluence buffers (CB) and passed through to a shift register 710. The top row of the FIG. 9 shows a chain of toggle flip-flops, punctuated by splitters, for dividing the master clock stream by factors of 2. The splitter provides access to these pulse streams of different frequencies (the master clock and its binary sub-harmonics). To implement the location assignment algorithm described above, D-flip-flop cells (detailed in FIG. 11) may be used to provide the right delay. A tree of asynchronous merger or confluence buffer cells (see FIGS. 15a and 15b) may be used to merge these different pulse streams ensuring the same path delay. The data is then synchronized in a shift register which may be of the type shown in FIGS. 12a and 12b. Some of the RSFQ cells mentioned above are described in more detail below.

Figure 10:
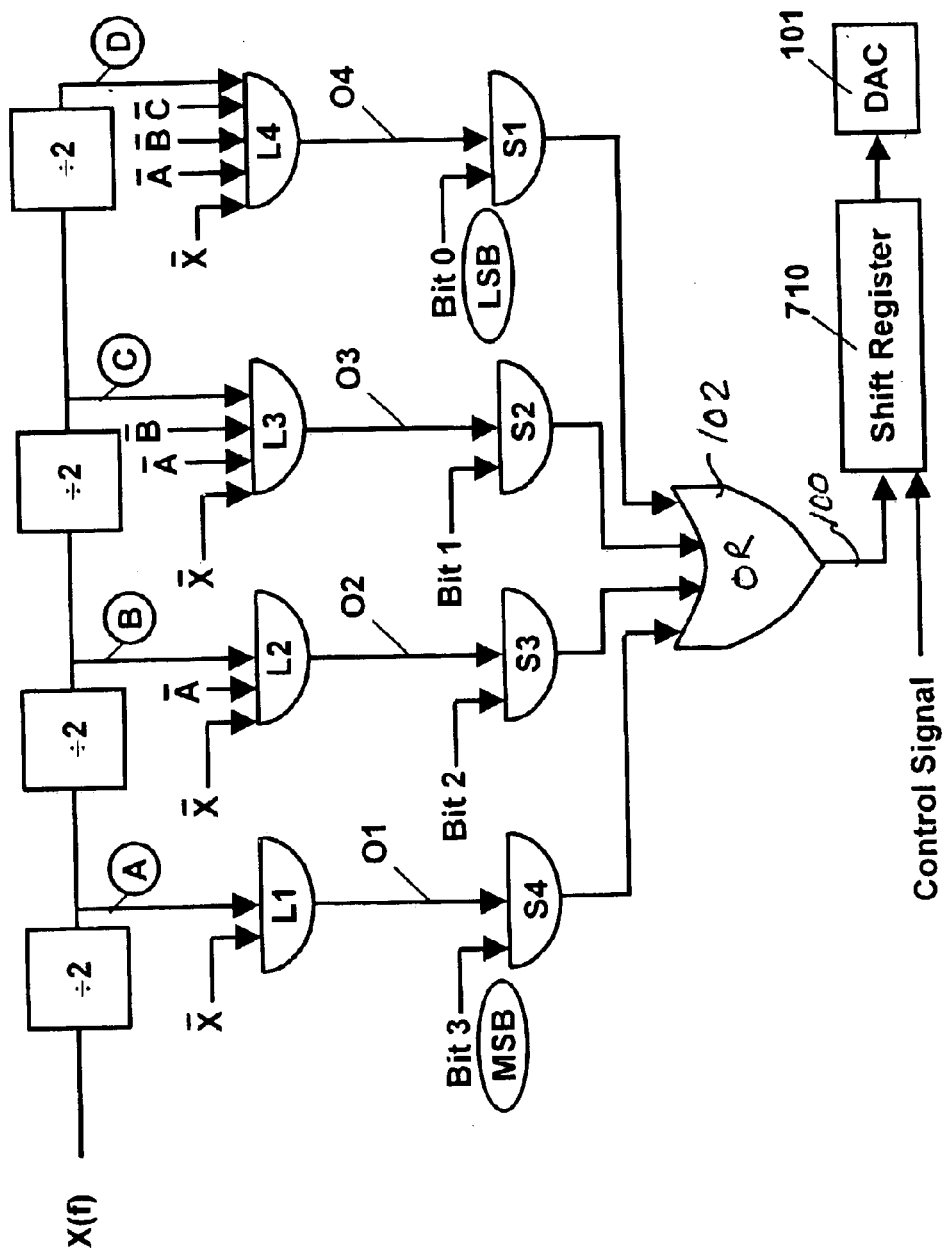
FIGS. 10 and 10A are, respectively, a block diagram of circuitry embodying the invention, and a waveform diagram for operating the circuitry of FIG. 10 in accordance with the invention.
Figure 10A:
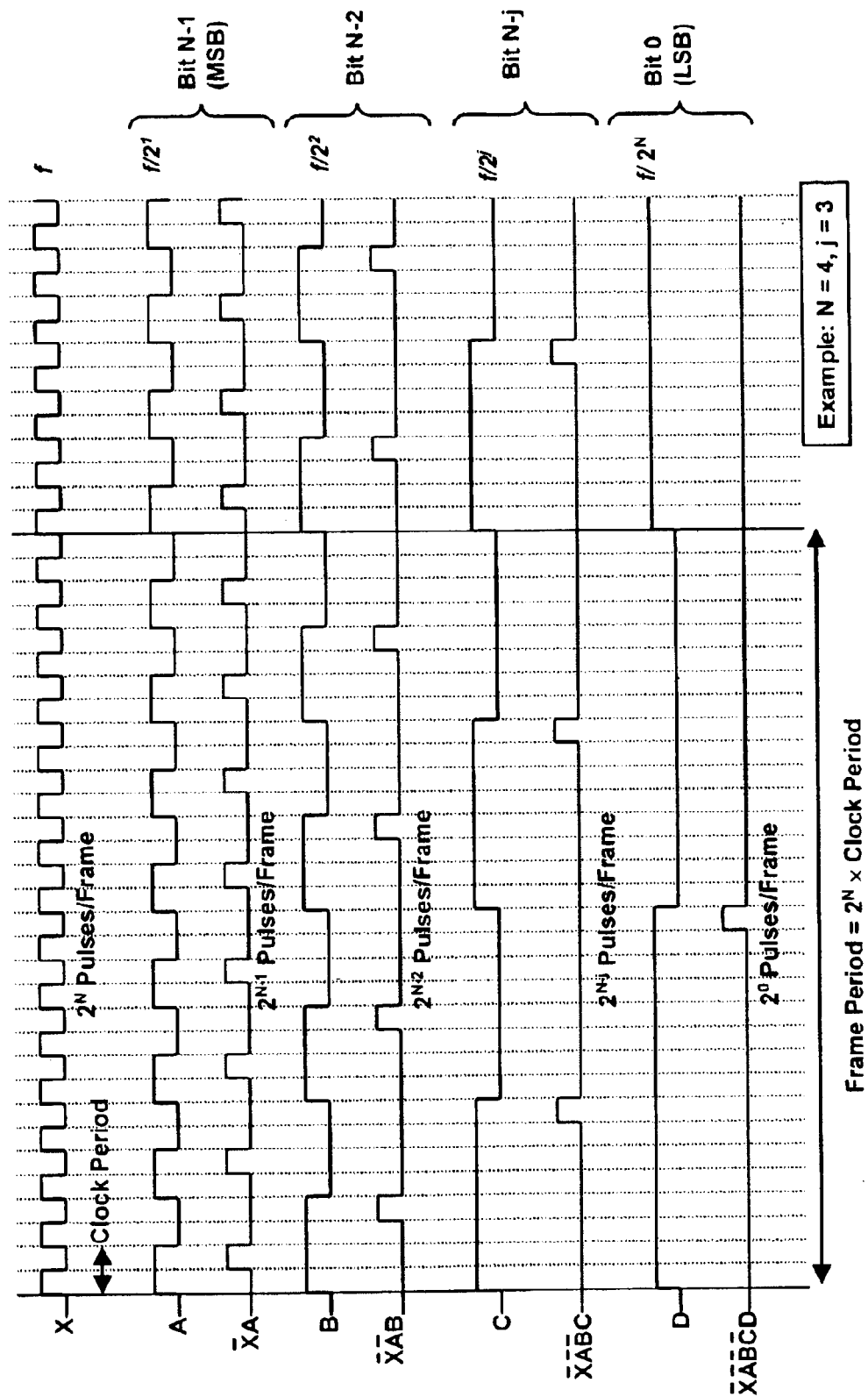

FIGS. 10 and 10A illustrate a circuit arrangement in which frequency signals derived from a clock (X) of frequency, f, are logically combined (gated) to generate pulses occupying unique time slots. The bits of a binary number can then be converted into a serial stream of pulses which are readily interleaved in accordance with the invention. Referring to FIG. 10 there is shown a clock X of frequency f applied to a series of four divide by two flip-flops. [This is by way of example only; it should be understood that many more stages may be used to correspond to the number of bits to be converted]. FIG. 10A shows the outputs (A, B, C D) produced using the four divide-by-two flop-flops. Each one of the outputs A, B, C D can then be modified using relatively simple logic gates (L1, L2, L3, L4) to produce unique outputs (O1, O2, O3, O4). The output O1 is obtained using L1 by logically "and'ing" A and X-not. The output O2 is obtained using L2 by logically "and'ing" B with X-not and A-not. The output O3 is obtained using L3 by logically "and'ing" C with X-not, A-not and B-not. The output O4 is obtained using L4 by logically "and'ing" D with X-not, A-not, B-not and C-not. An examination of FIG. 10A shows that the 8 pulses/cycle at O1, the 4 pulses/cycle at O2, the 2 pulses/cycle at O3 and the 1 pulse/cycle at O4 occur at different times. That is, each pulse has a different time slot during each frame or clocking period.

Each output (O1, O2, O3, O4) is coupled via a corresponding switch (S4, S3, S2, S1) to an OR gate 102 whose output is connected to an output bus 100. In its simplest form the outputs of the switches could be connected directly to output bus which would then function as a virtual-OR. That is, assuming each one of the switches (S1, S2, S3, S4) to be turned on, the 15 pulses from O1, O2, O3 and O4 would be produced on line 100. In FIG. 10, line 100 is shown connected to the input of a shift register 710 whose output is connected to the input of a digital-to-analog converter (DAC) 101. The pulses on line 100 would then be clocked into the shift register 710 by means of a control signal and could be stored in the register until the control signal advances or "outputs" the pulses contained in the shift register into DAC 101.

Alternatively, line 100 could be directly connected to the DAC, eliminating the need for a shift register.

As noted above, converting an N-bit (sometimes referred to as n-bit) number into an equivalent serial stream of one-bit pulses enables the use of a simple structure to convert a binary number into an analog voltage. In addition, a staggered (interleaved) thermometer encoder embodying the invention provides noise shaping (quantization noise power increases at higher frequencies away from the synthesized single tone) and predictably concentrates power more in the integral submultiples of the clock frequency. Thus enabling noise and any unwanted signals to be more easily filtered.

As noted, an encoder circuit embodying the invention may be composed of simple RSFQ cells of the type shown in FIGS. 11, 12, 13, 14 and 15.

Figure 11A:
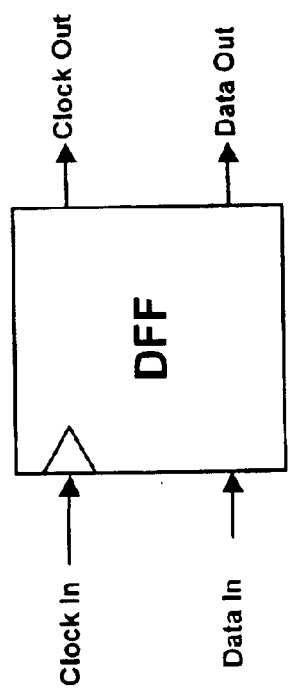
FIGS. 11(*a*) and 11(*b*) are, respectively, a symbolic representation of a D-flip flop and its circuit schematic.
Figure 11B:
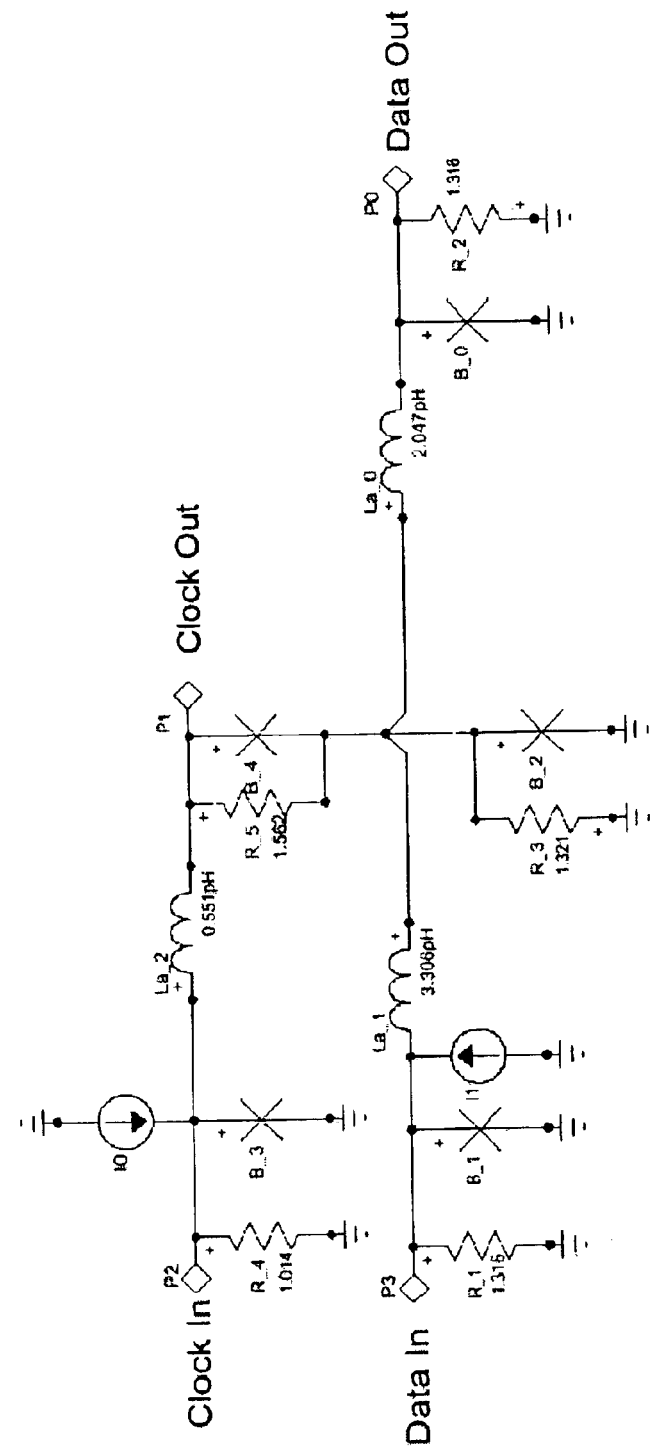

The D-type flip flop (DFF) cell shown in FIGS. 11(a) and 11(b) may be used as a digital delay element. An SFQ pulse arriving at the 'Data Input' sets the flip-flop to the '1' state. An output pulse is produced at the "Data Output" upon the subsequent arrival of an SFQ pulse at the 'Clock Input', which also propagates to the 'Clock Output'. These DFF cells may be concatenated to form a shift register 710 of the type shown in FIGS. 12a and 12b.

Figure 13A:
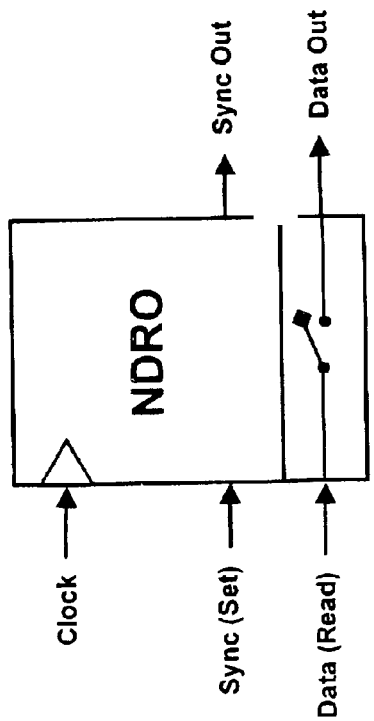
FIGS. 13(*a*) and 13(*b*) are, respectively the symbolic representation of an NDRO cell and its circuit schematic suitable for use as a switch in circuits embodying the invention.
Figure 13B:
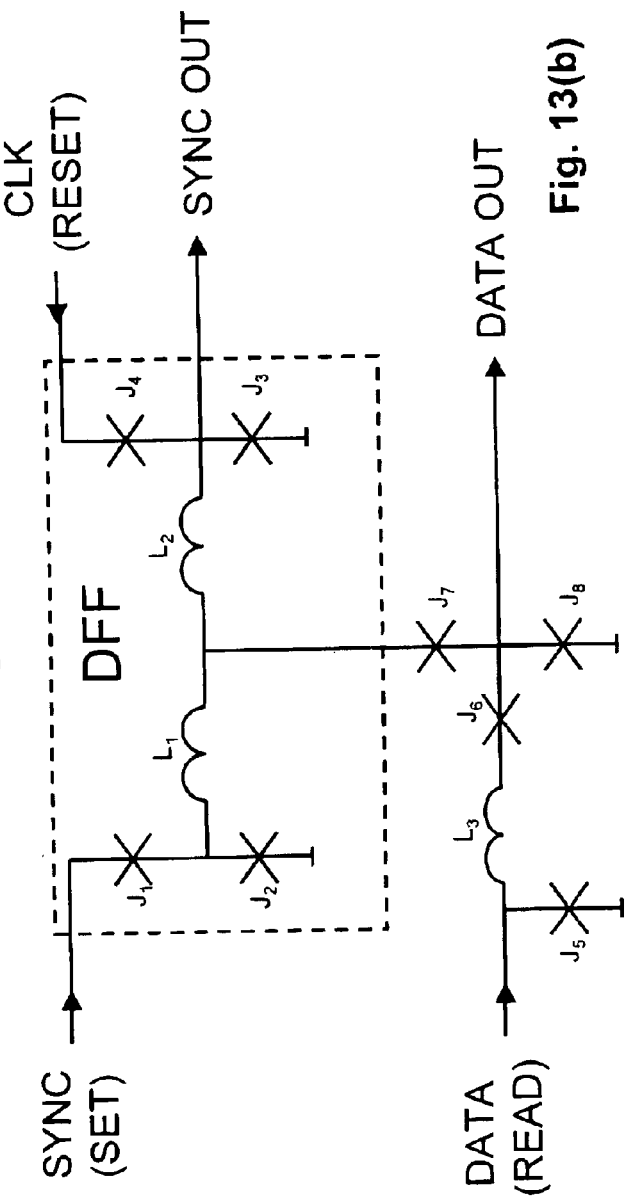

The DFF cell of FIGS. 11(a) and 11(b) can be modified to form a non-destructive readout (NDRO) cell, of the type shown in FIGS. 13(a) and 13(b), that can function as a switch. Thus, devices suitable for performing the switching function (S1–Sn) may be of the type shown in block form in FIG. 13(a) and schematically in FIG. 13(b). An SFQ pulse applied to the SYNC input sets the DFF to the '1' state. While it is in the '1' state, any pulse applied to the DATA input will be read out and an SFQ pulse will be produced at the output. This corresponds to the 'ON' (closed or turned-on) state of the switch. If a pulse is applied to the CLK input, the DFF is reset to the '0' state. While it is in the '0' state, any pulse applied to the DATA input will escape through J6 and no SFQ pulse will be produced at the output. This corresponds to the 'OFF' (open or turned-off) state of the switch.

A set of NDRO cells may also be used to act as a shift register to store the binary bits that can be loaded serially and can then be used to selectively activate the switches.

The switches ($S_1$–$S_n$) may be formed using NDRO type switches, as shown in FIGS. 13a, 13b. In the NDRO type switch, a corresponding binary bit is stored for non-destructive read out (NDRO) and the SFQ pulse stream is allowed to pass through only if the stored bit is a '1'. Alternatively, a simple dc switch may be used with a dc current being applied to the switch to turn it on to let pulses propagate through.

A bit from the n-bit word may be applied to the SYNC input and the frequency signals corresponding to that bit are applied to the DATA READ input. When the bit has a value of a logic "1", the DFF stores an SFQ pulse as a circulating current in the loop J2-L1-L2-J3, and applies a phase bias across $J_7$ and $J_8$. If it is in this state, when an SFQ pulse is applied to the DATA READ input, J8 switches to produce an output pulse on DATA OUT. When the bit has a value of a logic "0", there is no phase bias across $J_7$ and $J_8$. If it is in this state, when an SFQ pulse is applied to the DATA READ input, $J_6$ switches before $J_8$ and no output pulse is produced on DATA OUT.

A suitable toggle flip-flop (TFF) circuit is shown in block form in FIG. 14(a) and schematically in FIG. 14(b). A pulse arriving at the input alters the state of the flip-lop (from '0' to '1' or from '1' to '0'). A sequence of pulses alternately sets and resets the flip-flop, producing a pulse at the output for every other input pulse. Thus this circuit can work as a binary frequency divider.

Figure 15A:
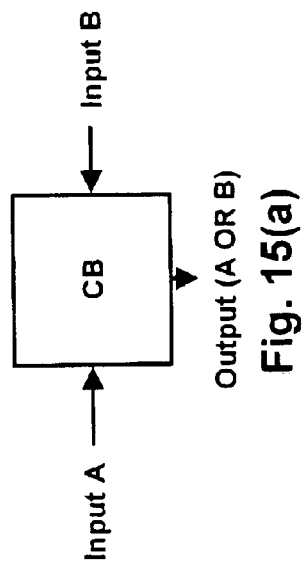
FIGS. 15(*a*) and 15(*b*) are, respectively, the symbolic representation of a confluence buffer cell which functions as an asynchronous OR gate and its circuit schematic.
Figure 15B:
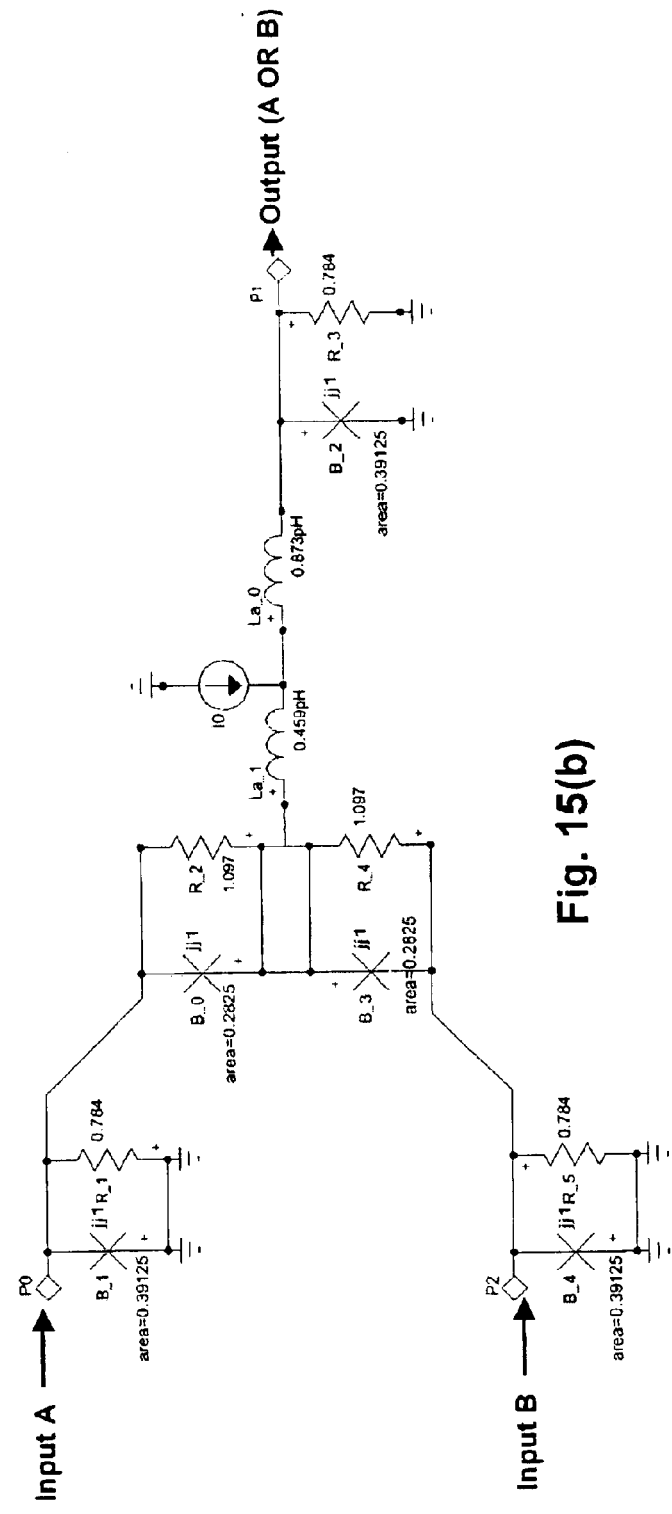
Figure 16:
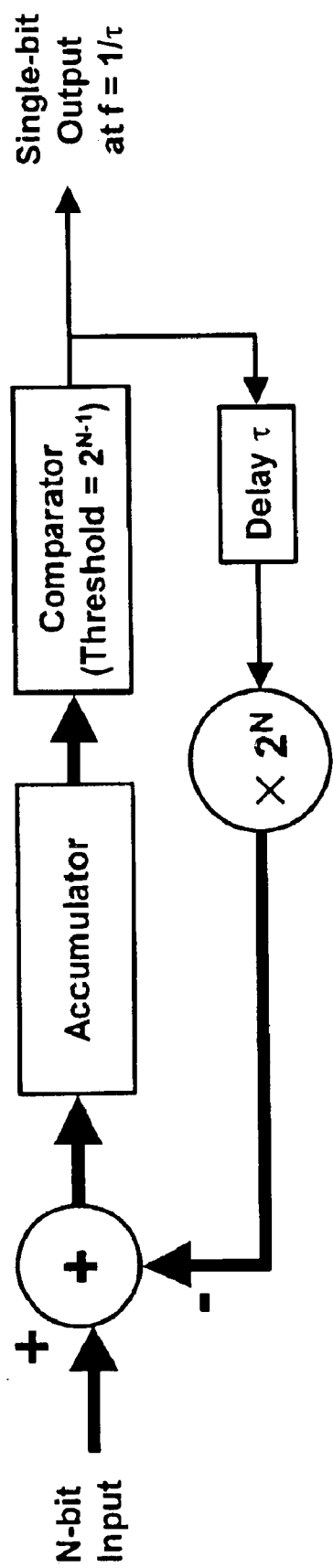
FIG. 16 is a block diagram of a Prior Art first-order delta-sigma converter for transforming an N-bit binary number into a single-bit sequence.

A confluence buffer of the type shown in block form in FIG. 15(a) and schematiclly in FIG. 15(b) includes an asynchronous two (or more) input OR gate that produces an SFQ pulse at the output every time a pulse arrives at either input.

TABLE 2

Comparison of different code generation schemes for 4-bit binary number (M)

| M (Dec) | M (Bin) | Interleaved Thermometer Code | Delta-Sigma Code | Standard Thermometer Code |
| --- | --- | --- | --- | --- |
| 0 | 0000 | 0000000000000000 | 0000000000000000 | 0000000000000000 |
| 1 | 0001 | 0000000010000000 | 0000000010000000 | 1000000000000000 |
| 2 | 0010 | 0000100000001000 | 0000100000001000 | 1100000000000000 |
| 3 | 0011 | 0000100010001000 | 0001000010000010 | 1110000000000000 |
| 4 | 0100 | 0010001000100010 | 0010001000100010 | 1111000000000000 |
| 5 | 0101 | 0010001010100010 | 0010010010001001 | 1111100000000000 |
| 6 | 0110 | 0010101000101010 | 0010100100101001 | 1111110000000000 |
| 7 | 0111 | 0010101010101010 | 0010101010010101 | 1111111000000000 |
| 8 | 1000 | 0101010101010101 | 0101010101010101 | 1111111100000000 |
| 9 | 1001 | 0101010111010101 | 1001010110101010 | 1111111110000000 |
| 10 | 1010 | 0101110101011101 | 1001101011011010 | 1111111111000000 |
| 11 | 1011 | 0101110111011101 | 1001101110110110 | 1111111111100000 |
| 12 | 1100 | 0111011101110111 | 1010111011101110 | 1111111111110000 |
| 13 | 1101 | 0111011111110111 | 1010111110111101 | 1111111111111000 |
| 14 | 1110 | 0111111101111111 | 1011101111111011 | 1111111111111100 |
| 15 | 1111 | 0111111111111111 | 1011111110111111 | 1111111111111110 |

What is claimed is:

1. A circuit for converting an ordered n-bit binary number into an equivalent single-bit sequence comprising:
n switching elements, each switching element having an input port, an output port and a control port for controlling the passage of a signal between the input port and the output port; where n is a an integer greater than one;
means for applying each bit of the n-bit word to the control port of a different one of said n switching elements; the n-bit word being ordered from a least significant bit (LSB) to a most significant bit (MSB);
a clock signal of frequency f;
a frequency divider circuit responsive to said clock signal for producing n different binary sub-harnonics of the frequency f from f/2 to $f/2^n$;
means for applying each sub-harmonic to the input port of a different switching element with each higher frequency signal being applied to the input port of a switching element having a higher order bit applied thereto, whereby the highest frequency signal (f/2) is applied to the input port of the switching element to which the MSB is applied and the lowest frequency signal is applied to the input port of the switching element to which the LSB is applied; and
means coupling the output port of said switching elements to a common point for producing thereat a serial single-bit data sequence.

2. The circuit as claimed in claim 1, wherein the single-bit sequence is a stream of pulses.

3. The circuit as claimed in claim 1, wherein the means coupling the output port of said switching elements to a common point includes a delay network for combining the signals produced at the output ports so the signals of one output do not overlap those of another output.

4. The circuit as claimed in claim 3, wherein the delay network comprises n delay elements, one for each frequency signal, ranging from (1/f) to $(2^{n-1}/f)$ stepped in factors of 2, the shortest delay (1/f) corresponding to the MSB and the longest delay $(2^{n-1}/f)$ corresponding to the LSB.

5. The circuit as claimed in claim 3 further including a shift register having an input coupled to said common point for receiving and storing the serial stream of single-bit pulses.

6. The circuit as claimed in claim 5, wherein said switching elements are formed of superconducting components; wherein said frequency divider circuit includes n divider circuits, each of which is formed by a superconducting component; and wherein said shift register is also formed of superconducting components.

7. The circuit as claimed in claim 5 wherein the shift register is a first-in, first-out buffer having at least $2^n-1$ locations for storing the up to $2^n-1$ pulses which may be produced at the common output point.

8. The circuit as claimed in claim 1 wherein said means for applying each sub-harmonic to the input port of a different switching element includes logic gates responsive to the different subharmonic frequencies for producing n sets of pulses, each set of pulses having a number of pulses corresponding to the frequency signal, with the pulses of one set of signals being formed in different time slots than the pulses of any other set.

9. A circuit as claimed in claim 1, further including digital-to-analog converting means for converting the serial stream of single-bit pulses into an analog voltage.

10. A circuit for converting an ordered n-bit binary number to a serial stream of single-bit pulses, where n is an integer greater than one, and the jth bit of the n-bit number is defined as bit (j−1) where "j" varies from 1 to n, and where the least significant bit (LSB) is defined as bit B(0) and the most significant bit (MSB) is defined herein as bit B(n−1), comprising:
means responsive to a clock signal of frequency, f, for producing n different sets of frequency signals; each set of frequency signals corresponding to a bit of the n-bit binary number; the set of frequency signal corresponding to each bit "j" being equal to $f/2^{(n+1-j)}$, where "j" is an integer which varies from one (1) for the LSB to n for the MSB;

n switching means; one switching means per bit of said n-bit number; each switching means having an input port, an output port and a control port;

means for applying each different bit of said n-bit number to the control port of a switching means and means for applying the set of frequency signals corresponding to the bit applied to the control port of a switching means to the input port of that switching means;

each switching means being responsive to the bit applied to its control port for propagating the signal present at its input port to its output port when the bit applied to the control port is a logic one ("1") and for blocking the propagation of the signal present at its input port to its output port when the bit applied to the control port is a logic zero ("0"); and means connected between the output ports of the n switching means and a common point for combining the signals at the output ports and producing a serial stream of single-bit pulses at the common point which is equivalent to the n-bit binary number.

11. A circuit as claimed in claim 10, wherein the means responsive to a clock signal include n divide-by-two circuits for producing n different frequency signals.

12. A circuit as claimed in claim 11 wherein the means connected between the output ports of the n switches and a common point for combining the signals at the output ports includes delay networks for ensuring that the frequency signals from the various outputs are interleaved with no overlap between the frequency signals.

13. A circuit as claimed in claim 12, wherein the delay corresponding to the jth bit, which is B(j−1), is $2^{n-j}/f$, where j ranges from 1 to n.

14. A circuit as claimed in claim 11 wherein means are coupled to the common point for converting the serial stream of pulses into an analog voltage.

15. A circuit as claimed in claim 14, further including an output buffer having at least $2^n-1$ locations connected to the common point for storing the serial stream of single bit pulses.

16. A circuit as claimed in claim 15 wherein the locations of the output buffer are filled such that where "j" varies from 1 for the MSB condition to n for the LSB condition, then corresponding to each Bit (n−j) there is produced $2^{(n-j)}$ pulses which occupy every $2^j$ th location of the buffer.

17. A circuit as claimed in claim 14 further including an output buffer connected to the common point, the output buffer having $2^n$ locations and, except for the first location, wherein the locations of the output buffer are filled such that where j varies from 1 for the MSB condition to n for the LSB condition, then corresponding to each Bit (n−j) there is produced $2^{(n-j)}$ pulses which occupy every $2^j$th location, starting with the $(1+2^{j-1})$th location.

18. A circuit as claimed in claim 17 wherein all the circuit components are superconducting circuits.

19. A circuit as claimed in claim 18 further including an output buffer connected to the common point, the output buffer having $2^n$ locations and, except for the first location, wherein the locations of the output buffer are filled such that where j varies from 1 for the MSB condition to n for the LSB condition, then corresponding to each Bit (n−j) there is produced $2^{(n-j)}$ pulses which occupy every $2^j$ th location, starting with the $(1+2^{j-1})$th location.

20. A circuit for converting an ordered n-bit binary number to a serial stream of single-bit pulses, where n is an integer greater than one, and the jth bit of the n-bit number is defined as bit (j−1) where "j" varies from 1 to n, and where the least significant bit (LSB) is defined as bit B(0) and the most significant bit (MSB) is defined herein as bit B(n−1), comprising:

means responsive to a clock signal of frequency, f, for producing n different sets of pulses; each set of pulses corresponding to a bit of the n-bit binary number; the number of pulses in a set of pulses corresponding to a bit "j" being equal to $2^{(j-1)}$ pulses, where "j" is an integer which varies from one (1) for the LSB to n for the MSB;

n switching means; one switching means per bit of said n-bit number;

each switching means having an input port, an output port and a control port;

means for applying each different bit of said n-bit number to the control port of a switching means and means for applying the set of pulses corresponding to the bit applied to the control port of a switching means to the input port of that switching means;

each switching means being responsive to the bit applied to its control port for propagating the signal present at its input port to its output port when the bit applied to the control port is a logic one ("1") and for blocking the propagation of the signal present at its input port to its output port when the bit applied to the control port is a logic zero ("0"); and means connected between the output ports of the n switching means and a common point for combining the signals at the output ports and producing a serial stream of single-bit pulses at the common point which is equivalent to the n-bit binary number.

21. A circuit as claimed in claim 20 wherein said means responsive to a clock signal of frequency, f, for producing n different sets of pulses includes gating means for producing said n different set of pulses with the pulses in each set of pulses occurring in different time slots.

22. A circuit as claimed in claim 21 wherein said means connected between the output ports of the n switching means and a common point for combining the signals at the output ports also includes digital to analog circuitry for converting the serial stream of pulses into an analog voltage.

23. A circuit as claimed in claim 21 means connected between the output ports of the n switching means and a common point for combining the signals at the output ports also includes an output buffer having at least $2^n-1$ locations connected to the common point for storing the serial stream of single bit pulses.

24. A circuit as claimed in claim 21 further including an output buffer connected to the common point, the output buffer having $2^n$ locations and, except for the first location, wherein the locations of the output buffer are filled such that where j varies from 1 for the MSB condition to n for the LSB condition, then corresponding to each Bit (n−j) there is produced $2^{(n-j)}$ pulses which occupy every $2^j$ th location, starting with the $(1+2^{j-1})$th location.

25. A combination comprising:

input circuit means for receiving a ordered n-bit binary number; where n is an integer greater than one;

means responsive to a clock signal having a frequency "f" for producing n different frequency signals; each different frequency signal corresponding to a different bit of the n-bit number and the set of frequency signal corresponding to each bit "j" being equal to $f/2^{(n+1-j)}$, where "j" is an integer which varies from one (1) for the least significant bit (LSB) to n for the most significant bit (MSB);

n switching means; one switching means per bit of said n-bit word each switching means having an input port, an output port and a control port;

means for applying a different bit of said n-bit number to a corresponding control port of said switching means;

means for applying the set of frequency signals corresponding to a bit to the input port of the switching means to whose control port the corresponding bit is applied; each switching means for propagating the signal present at its input port to its output port when the bit applied to its control port is a logic one ("1") and for blocking the propagation of the signal present at its input port to its output port when the bit applied to its control port is a logic zero ("0"); and means coupled between the output ports of the switching means and an output terminal for producing a serial stream of single-bit pulses which are equivalent to the n-bit word.

26. A circuit for converting an ordered n-bit binary number to a serial pulse stream, where the order of the n-bit binary ranges from the least significant bit (LSB), defined as bit 1, to the most significant bit (MSB), defined as bit n, comprising:

a pulse generating circuit for generating a different set of pulses corresponding to each bit (j) of the n-bit binary word, the number of pulses in a set of pulses corresponding to a bit being generally equal to $(K)2^{(j-1)}$; where K is a constant;

n switching means; one switching means per bit of said n-bit word; each switching means having an input port, an output port and a control port;

means for applying a different bit of said n-bit number to a corresponding control port of said switching means; whereby each switching means is responsive to a different one of the n bits of the n-bit word for propagating the signal present at its input port to its output port when the bit applied to the control port is a logic one ("1") and for blocking the propagation of the signal present at its input port to its output port when the bit applied to the control port is a logic zero ("0");

means for applying a different set of pulses to the input port of each switching means, the set of pulses whose number of pulses is equal to $(K)2^{(j-1)}$ being applied to the switching means to whose control port the $j^{th}$ bit is applied; and means for combining the outputs of the switches to an output terminal for producing a serial stream of single-bit pulses in which the pulses from each set of pulses are interleaved.

27. A method for converting an ordered n-bit (e.g., a 4 bit number) binary number into a serial stream of pulses, where the first bit which corresponds to the least significant bit (LSB) of the n-bit binary number is defined as Bit (0) and the most significant bit of the N-bit binary number is defined as Bit (N−1), comprising:

filling a shift register having $2^n$ locations with pulses corresponding to the for serially storing up to $2^n-1$ pulses;

generating n different sets of pulses; one set of pulses for each bit of the n-bit number; the number of pulses in each set of pulses corresponding to a particular Bit (n−j) being equal to $2^{(n-j)}$, where j varies from 1 to n, with 1 corresponding to the MSB and n corresponding to the LSB.

28. A method as claimed in claim 27 wherein the pulses fill the locations of a shift register having at least $2^n-1$ locations with the pulses from the different sets of pulses such that each Bit (n−j) occupies every $2^j$th location of the shift register, starting with the $(1+2^{j-1})$th location.

* * * * *